United States Patent [19]

Kuwahara

[11] Patent Number: 4,764,802
[45] Date of Patent: Aug. 16, 1988

[54] SEMICONDUCTOR DEVICES

[75] Inventor: Masashi Kuwahara, Kawasaki, Japan

[73] Assignee: Kabushiki Kaisha Toshiba, Kawasaki, Japan

[21] Appl. No.: 13,792

[22] Filed: Feb. 12, 1987

[30] Foreign Application Priority Data

Mar. 19, 1986 [JP] Japan .................. 61-61120

[51] Int. Cl.$^4$ ............................................. H01L 29/78
[52] U.S. Cl. .................................... 357/68; 357/23.1;
357/23.4; 357/23.14; 357/23.8
[58] Field of Search ............... 357/45, 68, 23.4, 23.14, 357/41, 23.1, 38, 23.8

[56] References Cited

U.S. PATENT DOCUMENTS

| | | | |
|---|---|---|---|
| 4,288,803 | 9/1981 | Ronen | 357/68 |
| 4,359,754 | 11/1982 | Hayakawa et al. | 357/68 |
| 4,399,449 | 8/1983 | Herman et al. | 357/23.8 |
| 4,680,604 | 7/1987 | Nakagawa et al. | 357/23.4 |

OTHER PUBLICATIONS

Chang et al., "25 AMP 500 Volt Insulated Gate Transistors", IEDM pp. 83-86, 1983.

*Primary Examiner*—Martin H. Edlow
*Assistant Examiner*—Donald J. Featherstone
*Attorney, Agent, or Firm*—Finnegan, Henderson, Farabow, Garrett & Dunner

[57] ABSTRACT

A semiconductor device comprises a drain region, base regions, gate electrodes formed over the drain region between two adjacent base regions through an insulating layer such that each bridges the surface of the drain region to partially cover the two adjacent base regions, source regions provided in the base regions, a source electrode provided on the source regions, and a metal gate electrode wiring contacting the gate electrodes. The metal gate electrode wiring includes closed loop portions and the source electrode is divided into branch sections, each corresponding to the closed loop portion.

5 Claims, 3 Drawing Sheets

SEMICONDUCTOR DEVICES

BACKGROUND OF THE INVENTION

This invention relates to a semiconductor device and, in particular, a semiconductor device containing a DMOS FET or a conductive modulation type MOS FET.

DMOS FET (double diffusion insulating gate longitudinal FET) or a conductive modulation type MOS FET has a high-speed switching characteristic and has been used primarily as a high-power type semiconductor device due to its small input loss and high input impedance. For example, DMOS FET contains an n-type drain region, a plurality of p-type base regions formed in the drain region, source regions formed in the base region, a source electrode formed on the source region and a gate electrode formed over the drain region between two adjacent base regions through an insulating layer. In the conductive modulation type MOS FET, a p-type anode region is formed under the aforementioned n-type drain region.

For ease in understanding this invention a semiconductor device containing a conventional conductive modulation type MOS FET will be explained below with reference to FIG. 1. FIG. 1 shows a plan view showing semiconductor device 10 having metal (aluminum) gate electrode wiring 2, aluminum source electrode 1 and gate electrode 3. The metal gate electrode wiring 2 electrically contacts gate electrode 3, formed of polysilicon. Aluminum source electrode 1 is patterned by aluminum gate electrode wiring 2 to provide a predetermined pattern, but is not divided into a plurality of aluminum source electrode branch sections. Gate electrodes 3, formed of polysilicon, are located under aluminum source electrode 1.

In semiconductor device 10, including metal gate electrode wiring 2 shown in FIG. 1, if the dimension of the semiconductor chip or a drain region formation region is increased to about 8.0×8.0 mm, gate electrode 3 of polysilicon becomes extremely longer and, as a result, its resistance becomes too great to be disregarded and, at the same time, its input capacity becomes greater. This causes a reduction in switching speed, an increase in input loss and a transient degeneration in drain current distribution. That is, when a MOS FET which is now in an on state is rendered off, the drain current distribution in the chip becomes nonuniform. In other words, the drain current is concentrated into that portion of the semiconductor device where the OFF-time delayed MOS FET is located, thus resulting in a breakdown of the aforementioned device portion. This causes a decrease in latching-up current, in the case of the conductive modulation type MOS FET, and a lowering in the $V_{DSX(SUS)}$ capability (i.e., a surge voltage absorption capability when the MOS FET is switched OFF) in the case of DMOS FET, with the result that the breakdown load current of the MOS FET at the switching-off time is lowered under such an inductive load as when a motor is driven.

SUMMARY OF THE INVENTION

One object of this invention is to provide a semiconductor device which can eliminate drawbacks as encountered in a conventional semiconductor device.

Another object of this invention is to provide a semiconductor device which can reduce a delay time from the OFF time of the gate voltage to that of the drain current, to allow the uniform distribution of a drain current, and hence can improve the breakdown load current of a MOS FET at a switching-off time.

A semiconductor device according to this invention is provided which comprises: a semiconductor substrate of a first conductivity type forming a drain region; a plurality of base regions of a second conductivity type formed in a first main surface portion of the semiconductor substrate; insulating layers, each formed on the surface of the drain region between two adjacent base regions so as to partially cover the two adjacent base regions; gate electrodes, each formed on the insulating layer; source regions of the first conductivity type formed in the base region; and a source electrode formed on the source regions. A metal gate electrode wiring is further provided which includes a plurality of closed loop portions. The metal gate electrode wiring electrically contacts the gate electrodes at those positions situated along the closed loop wiring portions. The source electrode is electrically divided into a plurality of branch sections, each corresponding to the closed loop wiring portion.

DETAILED DESCRIPTION OF THE PREFERRED EMBODIMENTS

Figure 2:
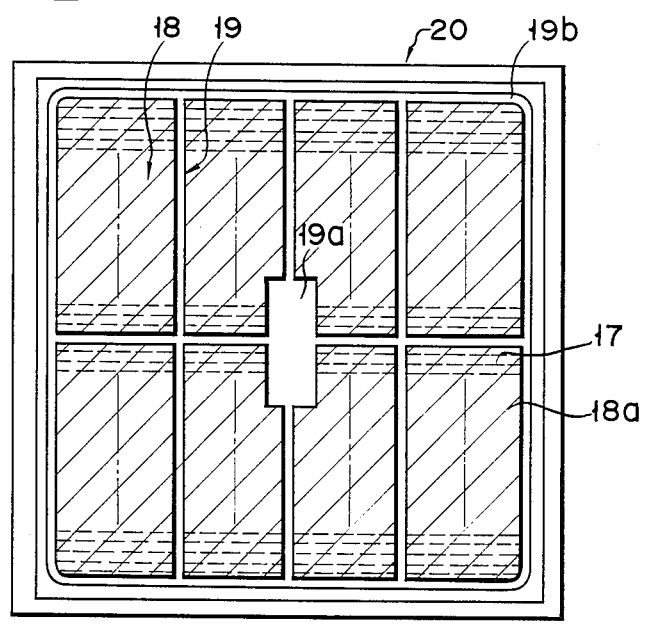
FIG. 2 is a plan view showing a semiconductor device according to one embodiment of this invention, including a conductive modulation type MOS FET.
Figure 3:
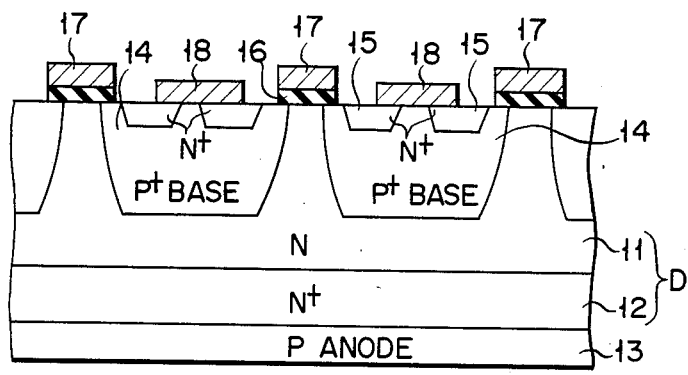
FIG. 3 is a cross-sectional view showing a conductive modulation type MOS FET for explaining the arrangement shown in FIG. 2.

FIG. 2 is a plan view showing semiconductor device 20 according to one embodiment of this invention, which includes conductive modulation type MOS FETs. FIG. 3 is a cross-sectional view showing the conductive modulation type MOS FET in which a semiconductor substrate D constitutes a drain region and contains N type region 11 having a main surface and N+ type region 12 contacting P type anode region 13. A plurality of P+ type base regions 14 are formed in the main surface portion of N type region 11. N+ type source regions 15, 15 are formed in the respective base region. Gate insulating layer 16 is formed on N type region 11 between two adjacent base regions 14 in a manner so as to partially cover the adjacent base regions 14. Gate electrode 17, formed of polysilicon, is formed on gate insulating layer 16. Source electrode 18, formed of aluminum, is formed such that it bridges that surface portion of P+ base region 14 defined between two adjacent N+ type source regions 15 and 15.

Semiconductor device 20 of this invention thus contains P anode region 13, drain region D, base regions 14 and source regions 15.

FIG. 2 shows a pattern, illustrating a number of gate electrodes 17, source electrode 18 and metal gate electrode wiring 19 electrically contacting gate electrodes 17. Metal gate electrode wiring 19, formed of aluminum, comprises a plurality of closed loop portions 19b (8 in this embodiment) and a center portion 19a, located substantially at the center of semiconductor device 20. Source electrode 18 is electrically divided into 8 source electrode branch sections 18a to correspond to 8 closed loop portions. Respective closed loop portions 19b contact gate electrodes 17, formed of polysilicon, along the closed loop portion. Gate electrodes 17, formed of polysilicon, are located, in a stripe-like fashion, under source electrode branch section 18a which is formed as an integral structure. The metal gate electrode wiring 19 is formed in a symmetric pattern with respect to its center portion.

Figure 4:
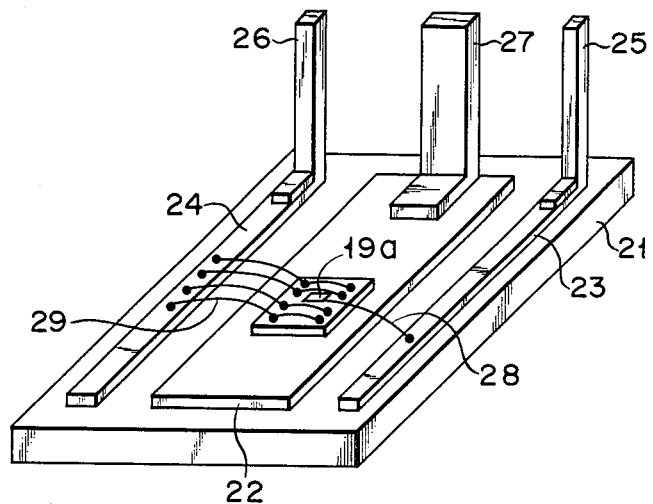
FIG. 4 is a perspective view showing an external connection relation of the semiconductor device of FIG. 2.

Semiconductor device 20, shown in FIG. 2, is mounted on a mounting metal plate 22 provided on ceramic base plate 21, with anode region 13 contacting the mounting metal plate 22 (FIG. 4). First and second metal plates 23 and 24 are formed on ceramic base plate 21. External connection lead 25, for gate electrode 17, is connected to first metal plate 23, and external lead 26, for source electrode branch sections 18a, is connected to second metal plate 24. Center portion 19a of metal gate electrode wiring 19 is connected to first metal plate 23 through bonding wire 28, and source electrode branch sections 18a are connected through corresponding bonding wires 29 to second metal plate 24.

Semiconductor device 20 of this invention, as shown in FIG. 2, has the following advantages.

First, when a chip of the same size is used for the formation of the structure where metal gate electrode wiring 19 and source gate branch sections 18a are connected respectively through bonding wires 28 and 29 to the corresponding external connection leads, it is possible to extend an active region on the chip. Second, metal gate electrode wiring 19 has closed loop portions 19b, gate electrodes 17 are connected to the respective closed loop portion and the source electrode 18 is divided into the plurality of source electrode branch sections 18a, whereby gate electrodes 17 of a shorter length can be realized to permit the charging and discharging of the gate electrodes to occur substantially uniformly in the chip to prevent a local concentration of drain current in the chip. It is, therefore, possible to increase the breakdown load current of the semiconductor device thus fabricated.

Figure 1:
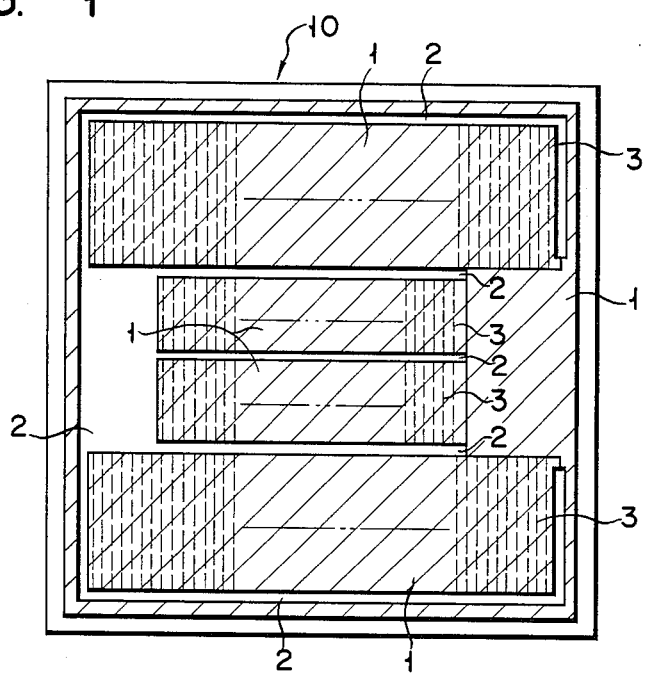
FIG. 1 is a plan view showing a conventional semiconductor device containing a conductive modulation type MOS FET.

The internal resistance of gate electrodes 17 in semiconductor device 20 of this embodiment was measured under the condition of f=1 MHz and found to be about 2.0 Ω. In semiconductor device 10, shown in FIG. 1, the internal resistance of the gate electrodes was about 4.0 Ω.

Figure 5:
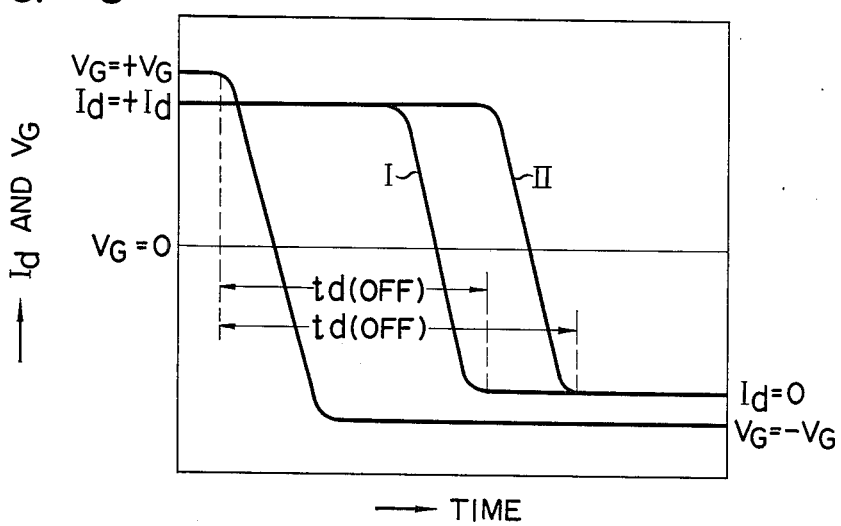
FIG. 5 shows characteristic curves showing a gate voltage-versus-drain current relation of the semiconductor device of FIG. 2.

Semiconductor device 20 of this embodiment was operated with an R (resistance) load connected thereto and then the drain current was cut off, in which case a waveform as shown in FIG. 5 was obtained. In FIG. 5, the coordinate denotes gate voltage $V_G$ and drain current $I_D$ and the abscissa denotes a time base, i.e., a delay time td (off) taken for the drain current to reach a zero level after the gate voltage has been started to reach a zero level. In FIG. 5, characteristic lines I and II correspond to semiconductor devices 20 (FIG. 2) and 10 (FIG. 1), respectively. As evident from the graph of FIG. 5, it is possible for the embodiment of FIG. 2 to markedly improve the delay time td (off).

Figure 6:
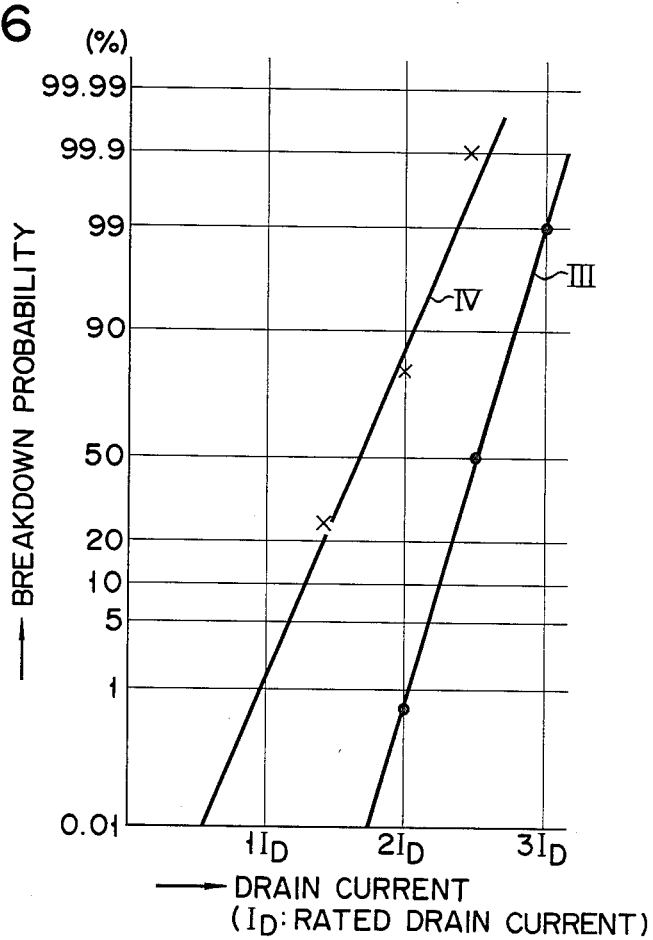
FIG. 6 is a characteristic graph showing a relation of a drain current of the semiconductor device of FIG. 2 to a breakdown probability.

Semiconductor devices 20 and 10 were tested, in a $V_{DSX(SUS)}$ mode (in a surge absorption mode of the semiconductor device at the switching-off time), for the breakdown load current, the result of which is as shown in FIG. 6. In FIG. 6 the abscissa denotes the drain current and the coordinate denotes the breakdown probability, noting that the lines III and IV correspond to semiconductor devices 20 and 10, respectively. As evident from the graph as shown in FIG. 6, the line III, upon comparison with the line IV, shows a prominently greater allowable drain current for the same breakdown probability. Conversely, if the drain current is the same, then it will be seen that the breakdown probability is very small for line III.

Although in the aforementioned embodiment, the semiconductor device containing the aforementioned conductive modulation type MOS FET has been explained, this invention can also be applied to the semiconductor device containing a DMOS FET. Needless to say, this invention can equally be applied to a semiconductor device containing a DMOS FET and a conductive modulation type MOS FET fabricated from the same chip.

What is claimed is:

1. A semiconductor device comprising:
    a semiconductor substrate of a first conductivity type forming a drain region;
    a plurality of base regions of a second conductivity type, formed in a first main surface portion of said semiconductor substrate;
    insulating layers, each of which is formed on the surface of said drain region between two adjacent base regions so as to partially cover the adjacent two base regions;
    gate electrodes, each formed on said insulating layer;
    source regions of the first conductivity type formed in said base region; and
    a source electrode formed on said source regions,
    wherein a metal gate electrode wiring is provided which includes a plurality of closed loop wiring portions electrically contacting said gate electrodes at those positions situated along said closed loop wiring portions, and said source electrode is electrically divided into a plurality of branch sections, each corresponding to said closed loop wiring portion.

2. A semiconductor device according to claim 1, wherein an anode semiconductor region of said second conductivity type is formed on a second main surface of said semiconductor substrate.

3. A semiconductor device according to claim 1, wherein said branch sections are connected to one another by bonding wire means.

4. A semiconductor device according to claim 1, wherein said metal gate electrode wiring is formed in a symmetric pattern with respect to its center portion.

5. A semiconductor device according to claim 1, wherein said gate electrode is formed of polysilicon and said metal gate electrode wiring is formed of aluminum.

* * * * *